(12) United States Patent
Huang

(10) Patent No.: US 11,189,650 B2
(45) Date of Patent: Nov. 30, 2021

(54) IMAGE SENSOR STRUCTURE AND MANUFACTURING METHOD THEREOF

(71) Applicant: TAIWAN SEMICONDUCTOR MANUFACTURING COMPANY LTD., Hsinchu (TW)

(72) Inventor: Yimin Huang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 56 days.

(21) Appl. No.: 16/397,464

(22) Filed: Apr. 29, 2019

(65) Prior Publication Data

US 2020/0343283 A1    Oct. 29, 2020

(51) Int. Cl.
*H01L 27/146*    (2006.01)
*H01L 29/08*    (2006.01)
*H01L 29/417*    (2006.01)

(52) U.S. Cl.
CPC .. *H01L 27/14612* (2013.01); *H01L 27/14689* (2013.01); *H01L 29/0847* (2013.01); *H01L 29/41725* (2013.01); *H01L 29/41766* (2013.01); *H01L 29/41783* (2013.01)

(58) Field of Classification Search
CPC ........ H01L 27/14612; H01L 27/14616; H01L 27/1462; H01L 27/14643; H01L 27/14689; H01L 29/0847; H01L 29/1033; H01L 29/1041; H01L 29/1045; H01L 29/41783; H01L 29/78; H01L 29/41766
See application file for complete search history.

(56) References Cited

U.S. PATENT DOCUMENTS

| | | | |
|---|---|---|---|
| 6,026,964 A * | 2/2000 | Hook | H01L 27/14609 257/292 |
| 10,079,261 B1 * | 9/2018 | Wang | H01L 27/14689 |
| 2013/0175606 A1 * | 7/2013 | Cheng | H01L 27/0883 257/329 |
| 2019/0019833 A1 * | 1/2019 | Kodaira | H04N 5/369 |

* cited by examiner

*Primary Examiner* — Marcos D. Pizarro
(74) *Attorney, Agent, or Firm* — WPAT, P.C., Intellectual Property Attorneys; Anthony King

(57) ABSTRACT

An image sensor structure and manufacturing method thereof are provided. The image sensor structure includes a substrate with a first surface. A first doped region of a first conductivity type is in the substrate and under the first surface. A second doped region of a second conductivity type is in the substrate and under the first surface. A gate structure is on the first surface of the substrate and overlapping a boundary of the first doped region and the second doped region. The epitaxial structure is on the first surface of the substrate. A method for manufacturing an image sensor structure is also provided.

20 Claims, 17 Drawing Sheets

IMAGE SENSOR STRUCTURE AND MANUFACTURING METHOD THEREOF

FIELD

The present disclosure is related to an image sensor structure and, more particularly, to an image sensor structure with an epitaxial structure on a surface of a substrate to avoid the damage of a photodiode region thereof.

BACKGROUND

Complementary metal oxide semiconductor (CMOS) image sensors (CIS) have become the main optical imaging technology for a wide variety of consumer and high-end scientific applications in recent years. The advantage of CMOS image sensor includes lower voltages requirement and less power consumption; moreover, it enables random access to image data, may be fabricated with compatible CMOS processes, and enables integrated single-chip cameras. The process of CMOS image sensors is also well-developed and cost-effective, thus it is less expensive than charge coupled device (CCD) sensors.

CMOS image sensor has a photodetector and a CMOS transistor switch for each pixel, allowing the pixel signals to be amplified individually, and thus reduce the noise that occurs when reading the electrical signals converted from captured light. The photodetector may include different types of photodiodes, such as pinned photodiodes with shallow PN junctions or PIN photodiodes. By operating the matrix of switches, the pixel signals can be accessed directly and sequentially, and at a much higher speed than a CCD sensor.

In CMOS image sensors, dark current (DC) is the signal that is generated in a typical pixel but not due to the absorption of a photon. The basic principle for image sensor operation is based around creating a pixel which has a collection area isolated and out of equilibrium. Then the photon-generated carriers can be collected and returning the volume back toward equilibrium. In the case of dark current occurs, the carriers are created by thermal process or high field effects. Dark current may exist at the surface of floating node and the defects near photodiode region in CMOS image sensors, and the phenomenon regarding the existence of dark current is white pixel (WP). Accordingly, it is a potential approach to decrease the defects and protect the photodiode region to avoid the issues of dark current and white pixel in CMOS image sensors.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
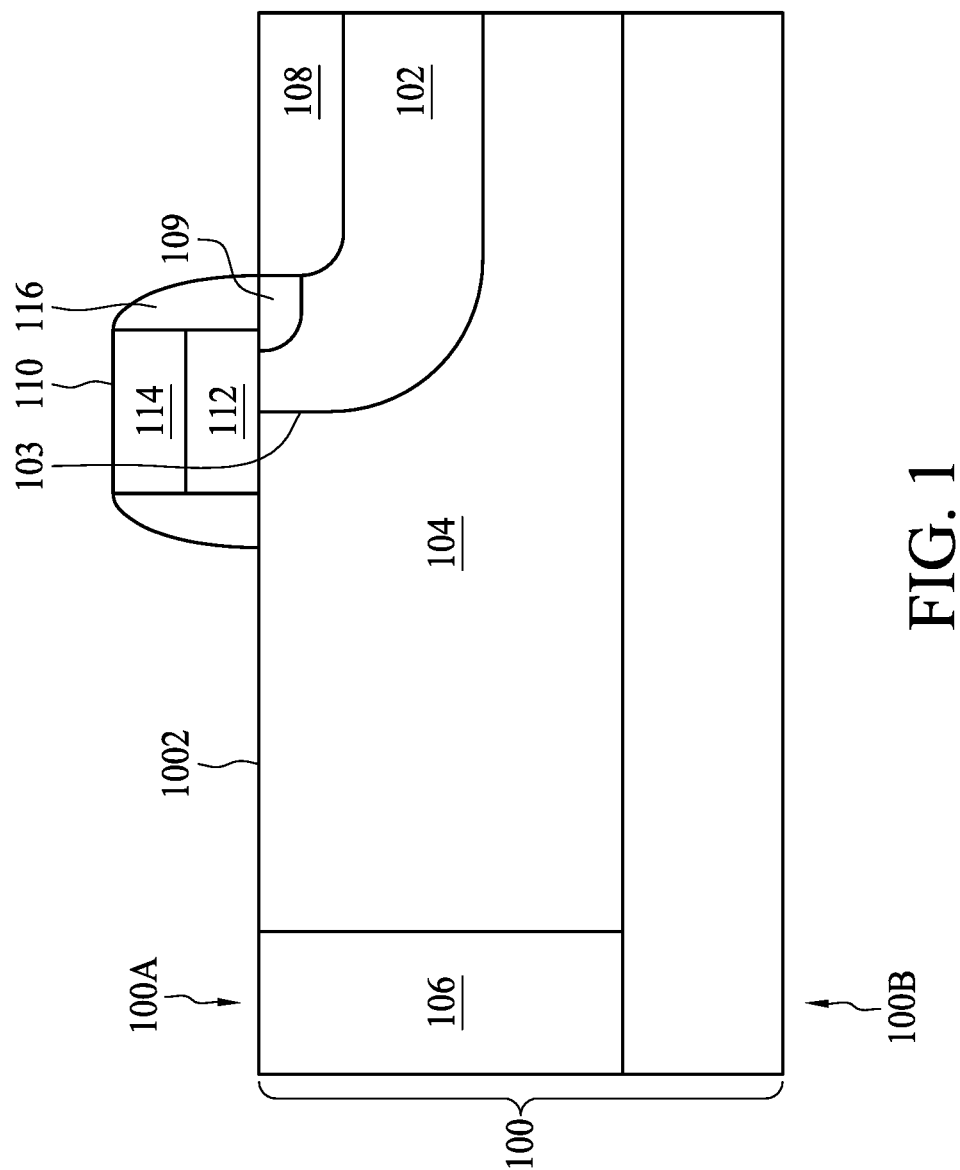
FIG. 1 illustrates a cross-sectional view at one of various operations of manufacturing an image sensor structure according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

Image sensor designs are improved to minimize substrate leakage current while maintaining good structural integrity and manufacturability. One common cause for increased substrate leakage current is structural damage during etching and implanting operations. Accordingly, dark current leakage and white pixel are generated as a result of etching- or implanting-induced complexities. In the present disclosure, as shown in later described FIG. 14A, at least an epitaxial structure is disposed on a surface of a substrate of an image sensor structure to render the bottom of conductive contacts further away from a photodiode region of the image sensor structure, and at least spatially spacing the structural damage (e.g., caused by etching and/or implanting) from the proximity of the photodiode region.

As shown in FIG. 1, the image sensor structure of the present disclosure includes a substrate 100 having a first surface 1002, a first doped region 102, a second doped region 104, a third doped region 106, and a fourth doped region 108.

The substrate 100 is a silicon substrate with a front side 100A and a back side 100B. In some embodiments, the substrate 100 may be other semiconductor material such as germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, and the like, may also be used. Additionally, the substrate 100 may comprise a silicon-on-insulator (SOI) substrate. Generally, an SOI substrate comprises a layer of semiconductor material such as epitaxial silicon, germanium, silicon germanium, SOI, silicon germanium on insulator (SGOI), or combinations thereof. The substrate 100 may be doped with a p-type dopant such as boron, boron fluorine, aluminum, gallium, or the like. The substrate may alternatively be doped with an n-type dopant such as phosphorus, arsenic, antimony, or the like.

The first surface 1002 is at the front side 100A. The first doped region 102 has a first conductivity type and is formed substantially near and under the first surface 1002. The first doped region 102 may be N-doped or P-doped. The dopant concentration may depend on the maximum voltage requirement of the semiconductor device. In some embodiments, the first doped region 102 may be formed by ion implantation with an implanter using P-type dopants, such as boron, aluminum, gallium, or combination thereof. The implanter may provide good control of the dopant concentration and ion penetration depth by different energy value of the implanter. For example, the ion penetration depth becomes deeper when the energy value of the implanter increases.

The second doped region 104 is formed substantially near and under the first surface 1002. The second doped region 104 has a second conductivity type which is opposite to the first conductivity type. In some embodiments, the second doped region 104 constitutes a portion of a photodiode region. In some embodiments, the second doped region 104 is an N-doped region which may be formed by ion implantation with N-type dopants, such as nitrogen, phosphorus, arsenic, or combination thereof. In some embodiments, the photodiode region may be an N-doped pinned photodiode (NPPD), partially pinned photodiode, photogate, or photo capacitor. In some embodiment, the second doped region 104 is a photoelectric conversion region. During operation, the incoming radiation that reaches the second doped region 104 may generate optical charges or photo-electrons that may be collected and accumulated. The photo-electrons may be transferred via a gate structure and may be converted into a digital signal.

The third doped region 106 is formed substantially near and under the first surface 1002, and interfacing with the second doped region 104. The third doped region 106 has a conductivity type identical to the first doped region 102. In some embodiments, the third doped region 106 is P-doped and be a deep P-well or as a source/drain region. The third doped region 106 may be formed by P-type dopants, such as boron, aluminum, gallium, or combination thereof.

The fourth doped region 108 is formed in the first doped region 102, and substantially near and under the first surface 1002. The fourth doped region 108 has a conductivity type opposite to the first doped region 102. In some embodiments, the fourth doped region 108 is N-doped and may be a floating diffusion (FD) region or a floating node. The fourth doped region 108 may be formed by N-type dopants, such as nitrogen, phosphorus, arsenic, or a combination thereof. The fourth doped region 108 may be formed subsequent to the first doped region 102. In some embodiments, the fourth doped region 108 further includes a fifth doped region 109 inside the boundary of the fourth doped region 108 and under the projection of the gate structure 110. The fifth doped region 109 may be a lightly doped drain (LDD) region.

As shown in FIG. 1, a gate structure 110 is formed on the first surface 1002 of the substrate 100 and overlapping a boundary 103 of the first doped region 102 and the second doped region 104. In some embodiments, the gate structure 110 is a transfer transistor to control a flow of charge carriers in a channel region formed between the first doped region 102 and the third doped region 106. In some embodiments, the gate structure 110 includes a gate dielectric layer 112 and a transfer gate electrode layer 114 formed on the gate dielectric layer 112. In some embodiment, the aforementioned fourth doped region 108 in the first doped region 102 is formed after forming the gate structure 110.

The gate dielectric layer 112 may be made of silicon oxide, silicon nitride, or a high dielectric constant material (high-k material). In some embodiments, the gate dielectric layer 112 is formed by a chemical vapor deposition (CVD) operation.

The transfer gate electrode layer 114 may be made of polysilicon (POLY) or any other suitable conductive material. The suitable conductive material includes but not limited to metal (e.g., tantalum, titanium, molybdenum, tungsten, platinum, aluminum, hafnium, ruthenium), metal silicide (e.g., titanium silicide, cobalt silicide, nickel silicide, tantalum silicide), or metal nitride (e.g., titanium nitride, tantalum nitride). In some embodiments, the transfer gate electrode layer 114 is formed by chemical vapor deposition (CVD), low pressure chemical vapor deposition, physical vapor deposition (PVD), atomic layer deposition, or spin-on. In some embodiments, the gate structure 110 is formed by forming the transfer gate electrode layer 114 on the gate dielectric layer 112, and then patterning the transfer gate electrode layer 114 by etching to form the gate structure 110.

The spacers 116 are formed on the sidewalls of the gate structure 110. In some embodiments, the spacers 116 are made of silicon oxide, silicon nitride, silicon oxynitride, or other applicable material. In some embodiments, the spacers 116 are formed by chemical vapor deposition (CVD), plasma enhanced CVD, sputter, or physical vapor deposition (PVD).

As shown in FIG. 1, the first surface 1002 of the substrate 100 is generally a flat surface over a portion of the fourth doped region 108, the second doped region 104, and the third doped region 106. In some comparative embodiments, during the contact formation operations, at least the fourth doped region 108 and third doped region 106 in proximity to the first surface 1002 may be damaged by etching or ion implantation operations. The damaged region and the disorder cluster that result from etching and ion implantation are in proximity to the photodiode region (e.g., including the first doped region 102, the second doped region 104, and the third doped region 106) and may serve as defect center that degrade the material integrity of the semiconductor structure, so as to generate dark current and while pixel, as previously addressed. Accordingly, the present disclosure provides an image sensor structure with at least an epitaxial structure grown over the first surface 1002 so as to avoid the dark current and white pixel issues.

Figure 2:
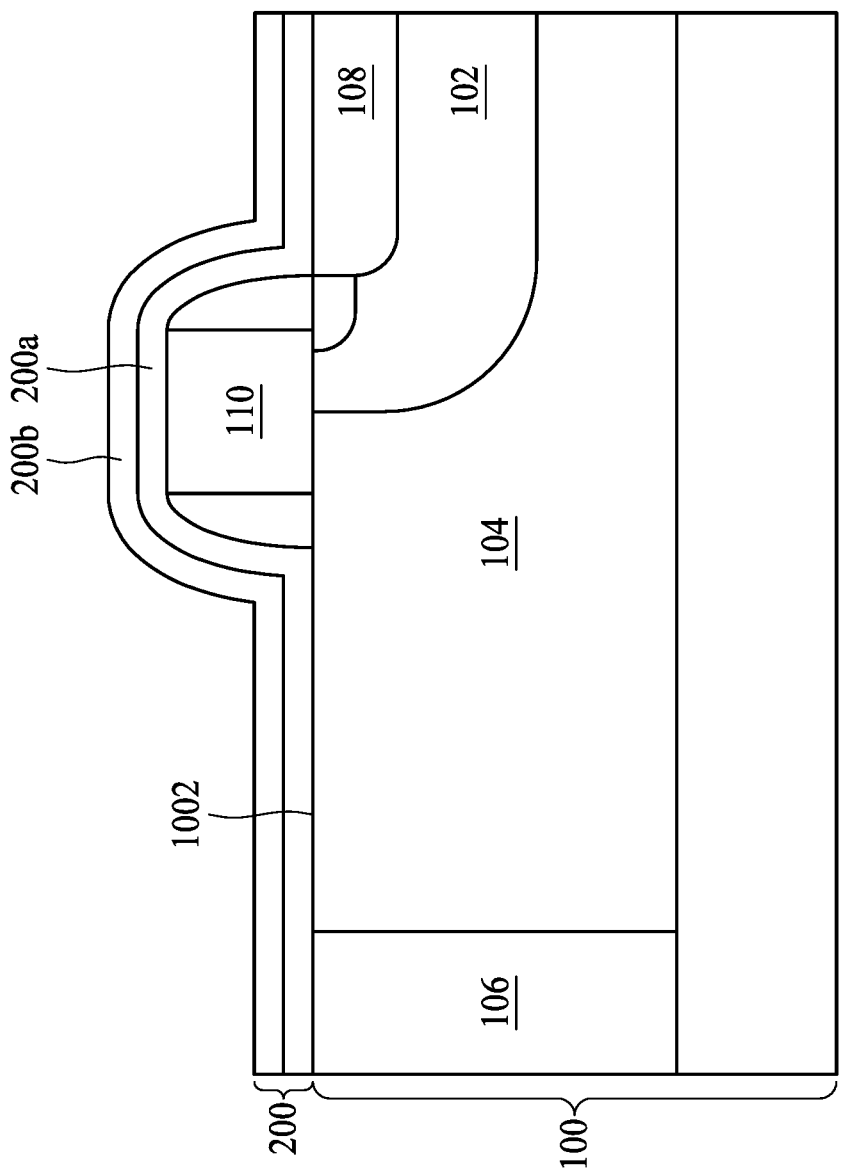
FIGS. 2, 3, 4, 5, and 6 illustrate cross-sectional views at various operations of manufacturing an image sensor structure according to some embodiments of the present disclosure.

As shown in FIG. 2, a first masking layer 200 is formed over the first surface 1002 of the substrate 100. The first masking layer 200 is formed to be in contact with the fourth doped region 108, the second doped region 104, and the third doped region 106 at the first surface 1002. The first masking layer 200 is made of silicon nitride, polysilicon, or oxide. In some embodiments, the first masking layer 200 may be composed by multiple sub-layers. Refer to FIG. 2, a first oxide layer 200a is firstly deposed on the first surface 1002 and the gate structure 110. The thickness of the first oxide layer 200a is between about 50 Å to about 100 Å. The other sub-layer of the first masking layer 200 is a first silicon nitride layer 200b, which is deposed on the first oxide layer 200a. The thickness of the first silicon nitride layer 200b is between about 400 Å to about 600 Å.

Figure 3:
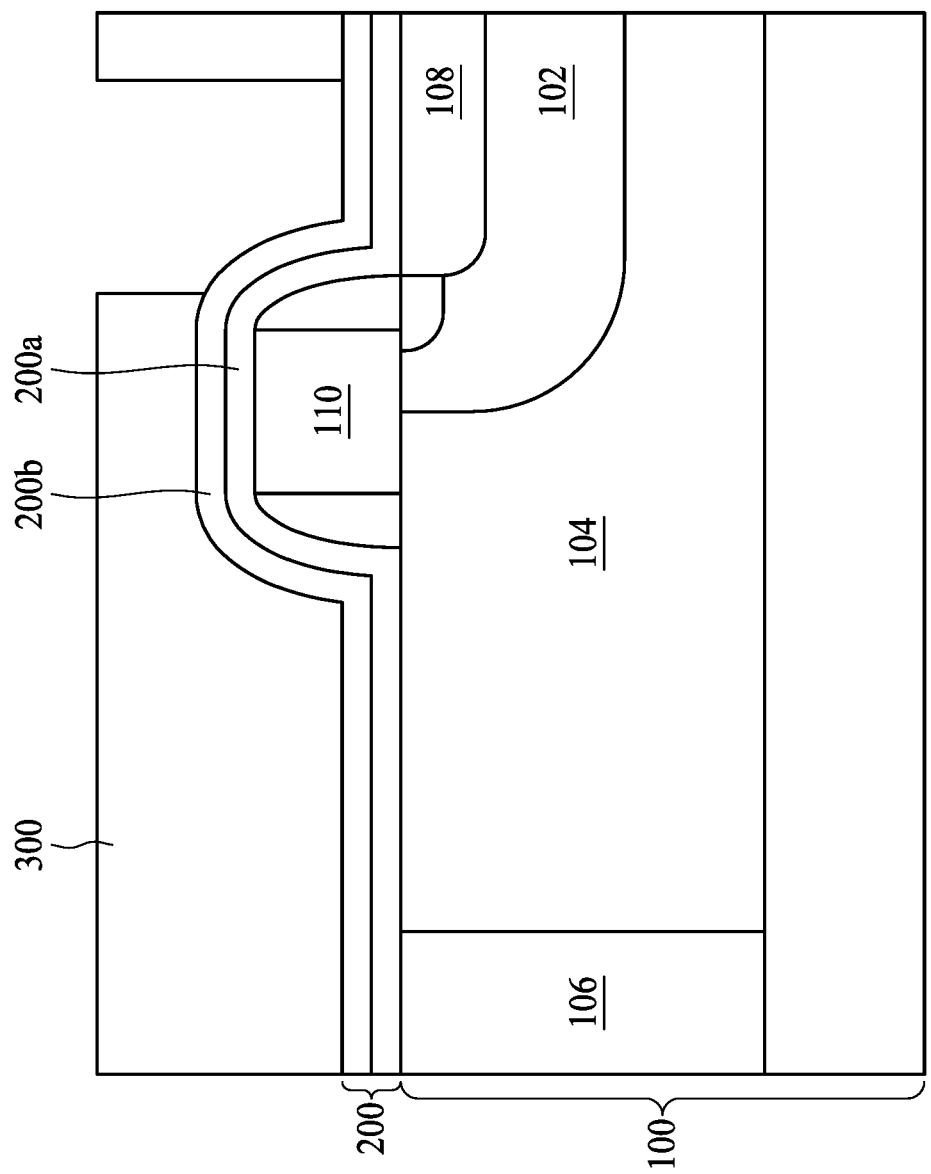
Figure 4:
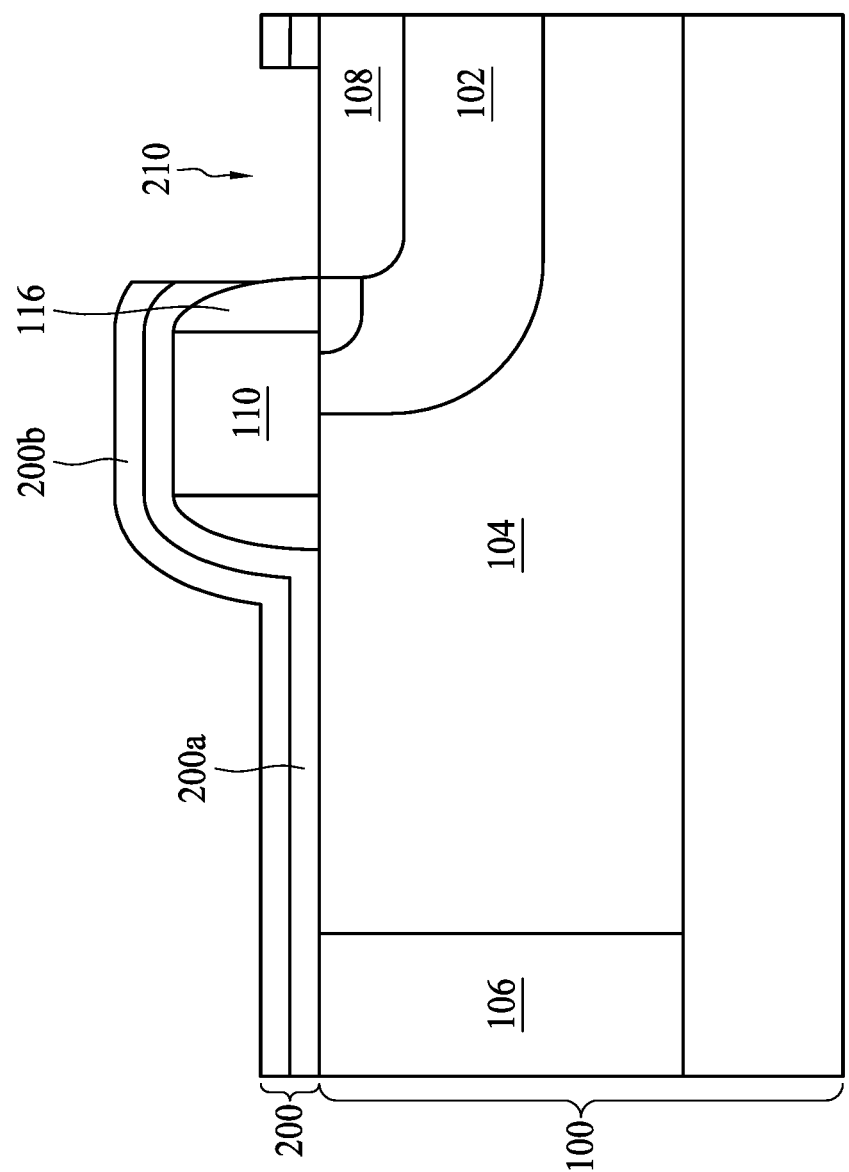

As shown in FIGS. 3 and 4, the first masking layer 200 is patterned to have a first opening 210 to expose the first doped region 102 and the fourth doped region 108. In some embodiments, the first masking layer 200 is patterned by photoresist (PR) and an etching operation. The first photoresist layer 300 is formed on the first masking layer 200 with a pattern to expose the first doped region 102. In some embodiments, the first photoresist layer 300 is formed by spin-coating or chemical vapor deposition (CVD). In some embodiments, portion of the spacer 116 adjacent to the first doped region 102 is also exposed by the first opening 210.

As shown in FIG. 4, a portion of the first masking layer 200 is removed by etching and the first opening 210 is thus formed. The first doped region 102 and the fourth doped region 108 are exposed and available to be further operated.

Figure 5:
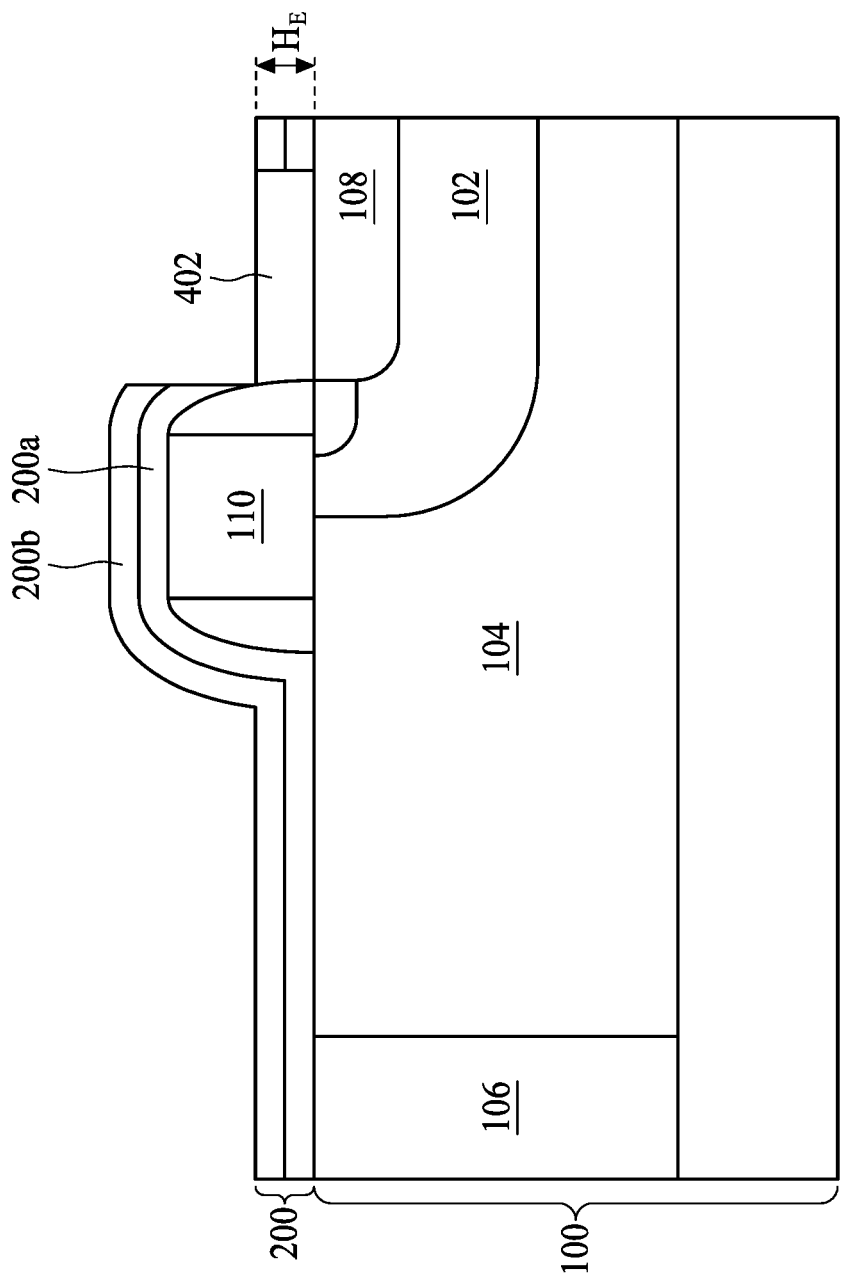

A shown in FIG. 5, a first epitaxial structure 402 is formed on the first surface 1002 of the substrate 100 over the first doped region 102 and the fourth doped region 108 by epitaxial growth at the first opening 210 (shown in FIG. 4). The first epitaxial structure 402 may be doped during epitaxial growth by adding impurities to the source gas. In some embodiments, the first epitaxial structure 402 has a conductivity type which is opposite to the first doped region 102 but same as the fourth doped region 108 in the first doped region 102. In some embodiments, the first epitaxial structure 402 is N-doped and the impurities in source gas may be nitrogen, phosphorus, arsenic, or a combination thereof. In some embodiments, the first epitaxial structure 402 has N-type conductivity and is in contact and integrated with the fourth doped region 108.

In some embodiments, the first epitaxial structure 402 is protruded from the first surface 1002 of the substrate 100 with a height $H_E$ from about 200 Å to about 800 Å over the first surface 1002 of the substrate 100. The height $H_E$ depends on the extent of recess of the contact plugs (not shown) into the first epitaxial structure 402. In some embodiments, the height $H_E$ is greater than the recess of the contact plugs in the first epitaxial structure 402, so that the contact plugs are raised from the first surface 1002 of the substrate 100.

By forming the first epitaxial structure 402, a bottom portion of the contact plugs may be in contact with and surrounded by the first epitaxial structure 402 instead of the substrate 100. Accordingly, the fourth doped region 108 and the first doped region 102 in the substrate 100 may not be damaged by etching or ion implantation operations conducted during the contact formation operation. In other words, the damaged region and the disorder cluster caused by etching and ion implantation, if any, may be spaced from the photodiode region by the first epitaxial structure 402. Therefore, the dark current and white pixel may be alleviated.

Figure 6:
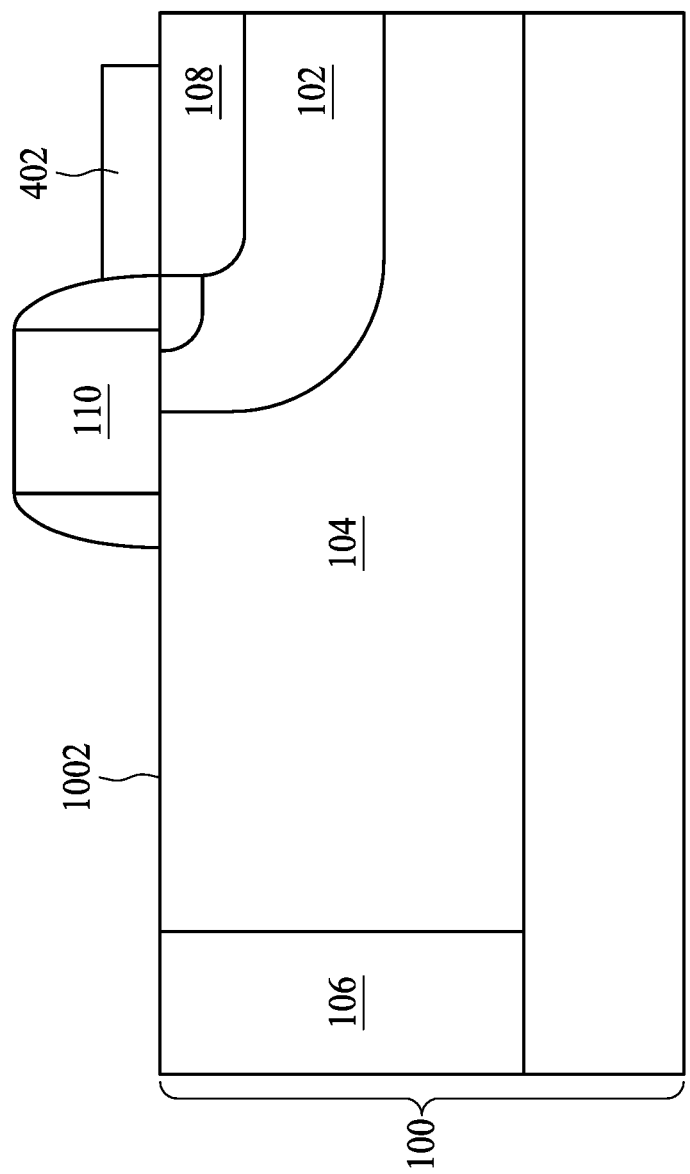

As shown in FIG. 6, after forming the first epitaxial structure 402, the first oxide layer 200a (shown in FIG. 5) and the first silicon nitride layer 200b (shown in FIG. 5) are both removed to expose the gate structure 110, the second doped region 104 and the third doped region 106. In some embodiments, the first masking layer 200 (shown in FIG. 5) includes the first oxide layer 200a and the first silicon nitride layer 200b is removed by using a technique such as chemical-mechanical polishing (CMP), plasma etching, wet etching, or dry etching.

Figure 14A:
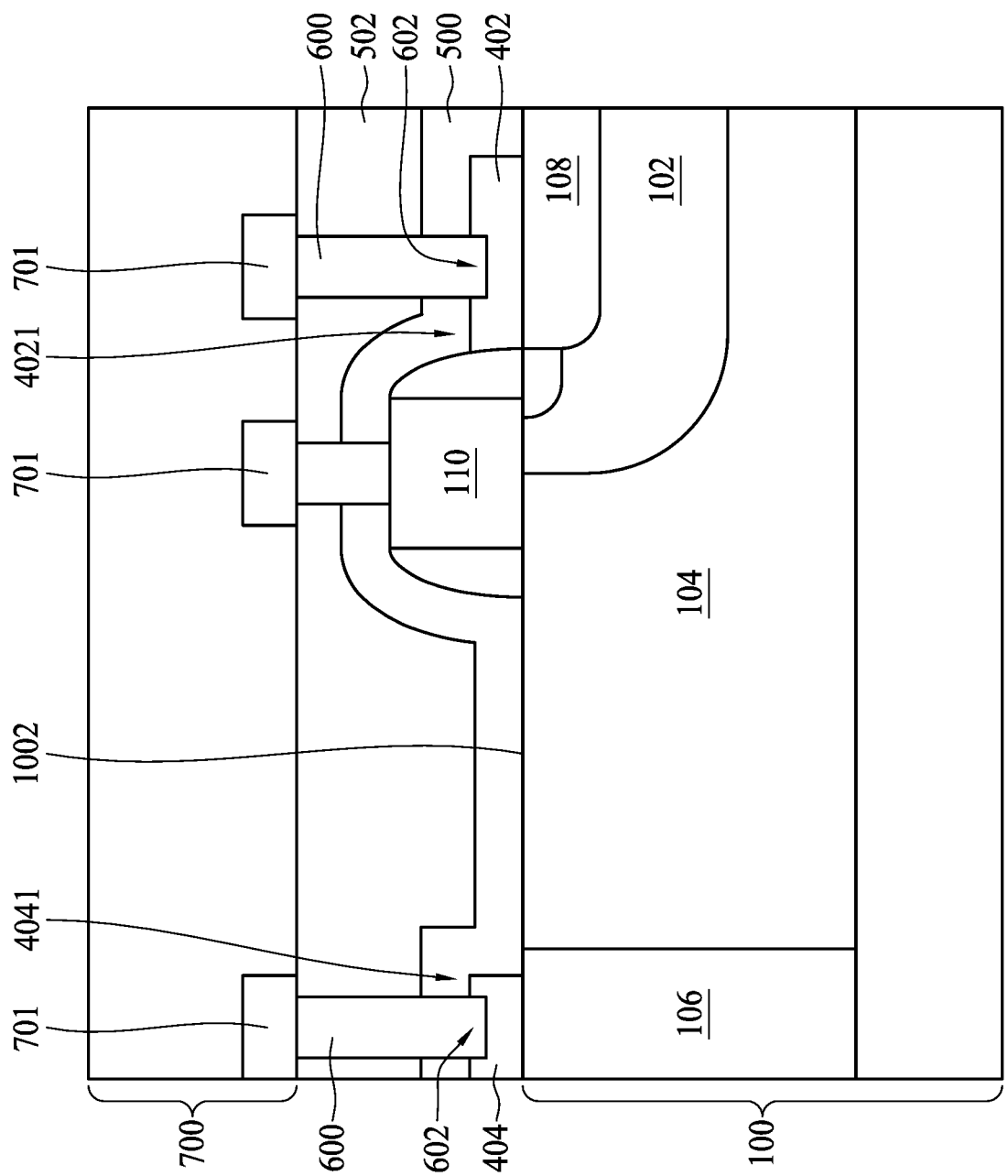
FIG. 14A illustrates a cross-sectional view of an image sensor structure according to some embodiments of the present disclosure.
Figure 14B:
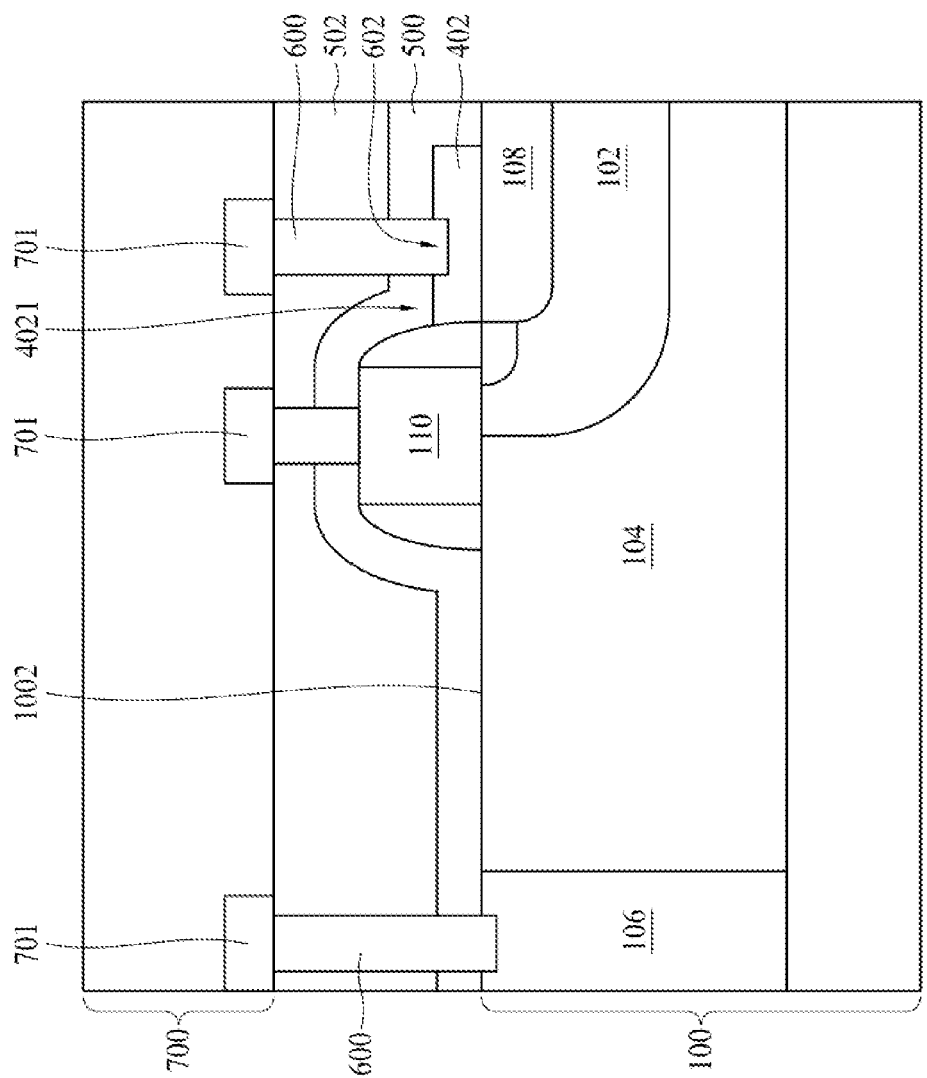
FIG. 14B illustrates a cross-sectional view of an image sensor structure according to some embodiments of the present disclosure.

The epitaxial structure in the present disclosure is not limited to the raise floating node, as illustrated in FIG. 6. In some embodiments, the epitaxial structure may include an additional portion, for example, which is formed on the third doped region 106. In some embodiment, as shown in FIG. 14B, an epitaxial structure is formed on the first surface 1002 of the substrate 100 to raise the height of the floating node (e.g., including the first epitaxial structure 402 and the fourth doped region 108) from the first surface 1002. In some embodiments, as shown in FIG. 14A, an epitaxial structure is formed on first surface 1002 of the substrate 100 not only to raise the height of the floating node but also integrated with the third doped region 106.

Figure 7:
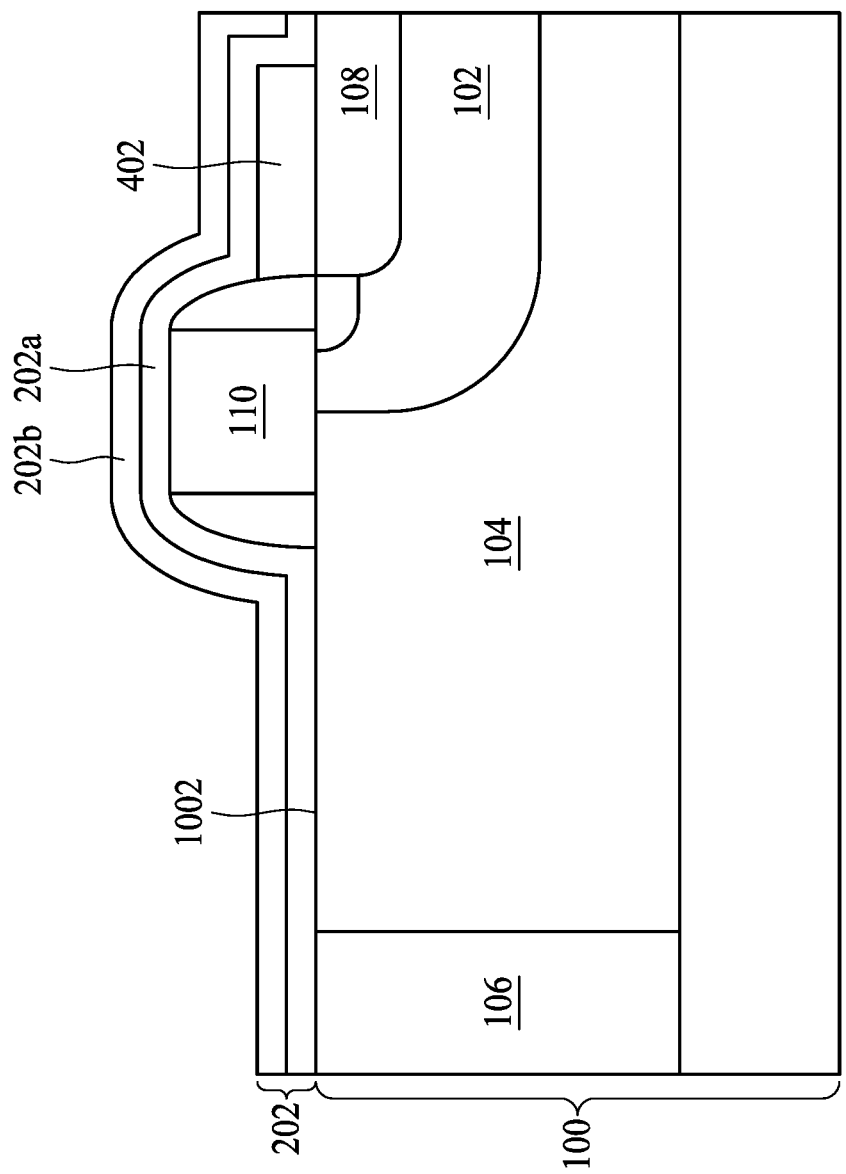
FIGS. 7, 8, 9, 10, and 11 illustrate cross-sectional views at various operations of manufacturing an image sensor structure according to some embodiments of the present disclosure.

As shown in FIG. 7, a second masking layer 202 is formed over the first surface 1002 of the substrate 100. Based on the manufacturing operations as shown in FIG. 2 to FIG. 6, the first epitaxial structure 402 is previously formed and thus being covered by the second masking layer 202. Alternatively stated, after the formation of the second masking layer 202, a bottom of the second masking layer 202 is in contact with a top of the first epitaxial structure 402. The second masking layer 202 is made of silicon nitride, polysilicon, or oxide. In some embodiments, the second masking layer 202 may be composed by multiple sub-layers. Refer to FIG. 7, a second oxide layer 202a is firstly deposed on the first surface 1002, the gate structure 110, and the first epitaxial structure 402. The thickness of the second oxide layer 202a is between about 50 Å to about 100 Å. The other sub-layer of the second masking layer 202 is a second silicon nitride layer 202b, which is deposed on the second oxide layer 202a. The thickness of the second silicon nitride layer 202b is between about 400 Å to about 600 Å.

Figure 8:
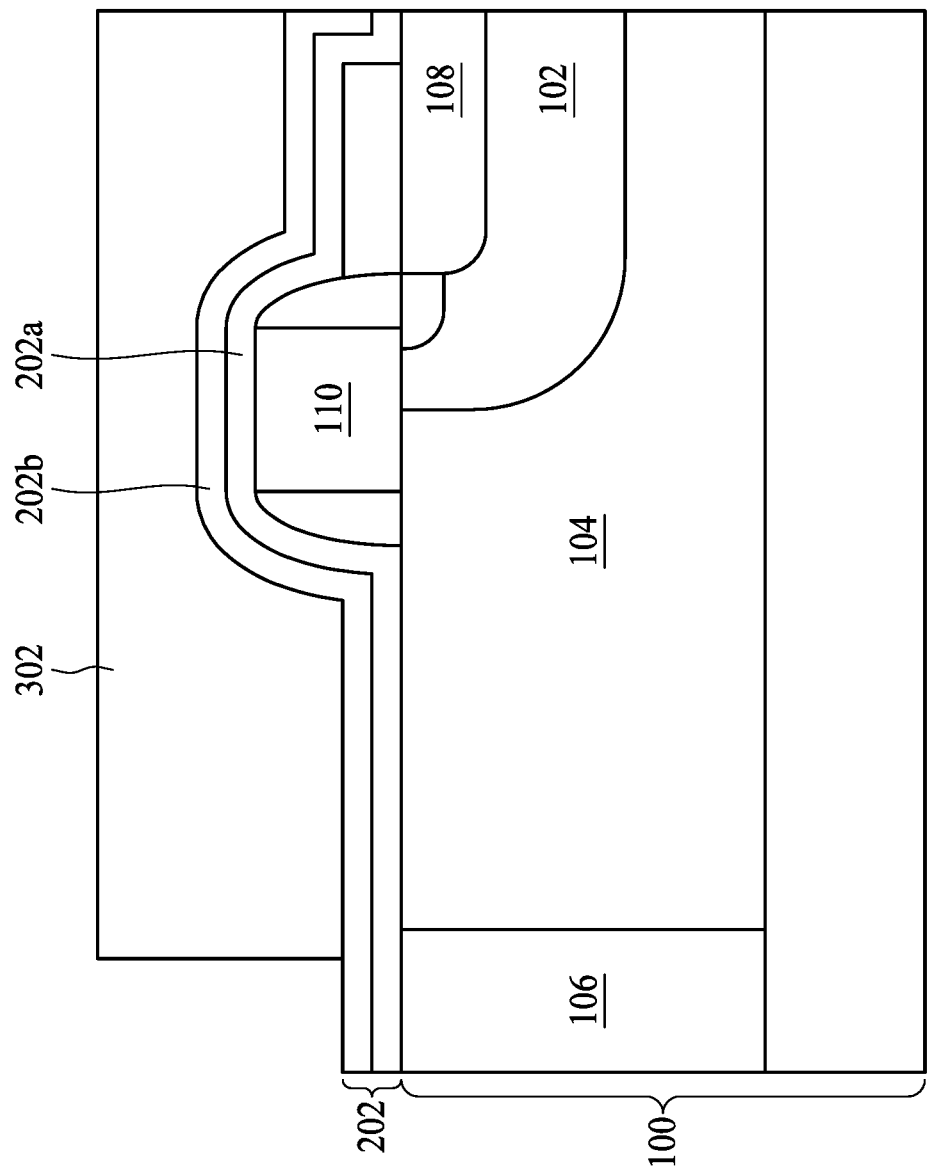
Figure 9:
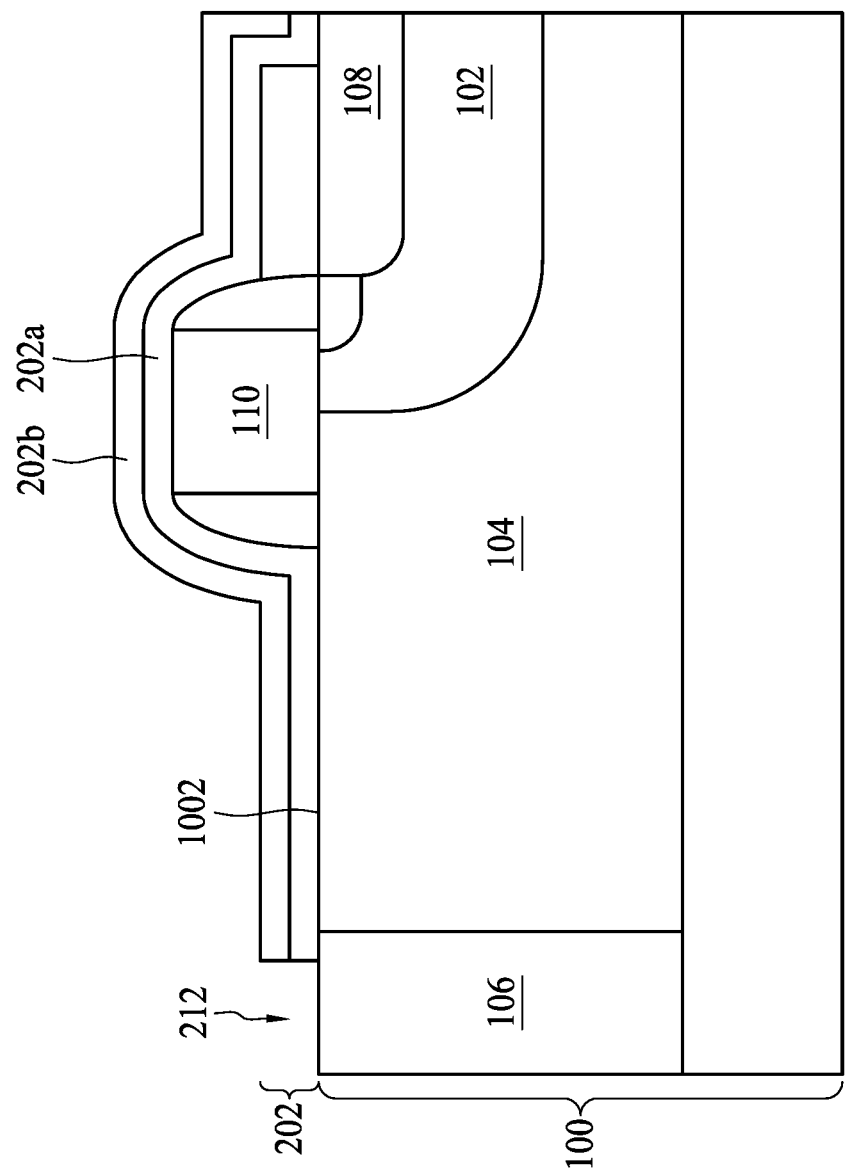

As shown in FIG. 8 and FIG. 9, the second masking layer 202 is patterned to have a second opening 212 exposing the third doped region 106. In some embodiments, the second masking layer 202 is patterned by photoresist (PR) and an etching operation. The second photoresist layer 302 is formed on the second masking layer 202 with a pattern to expose the third doped region 106. In some embodiments, the second photoresist layer 302 is formed by spin-coating or chemical vapor deposition (CVD).

As shown in FIG. 9, a portion of the second masking layer 202 is removed by etching and the second opening 212 is thus formed. The third doped region 106 is exposed and available to be further operated.

Figure 10:
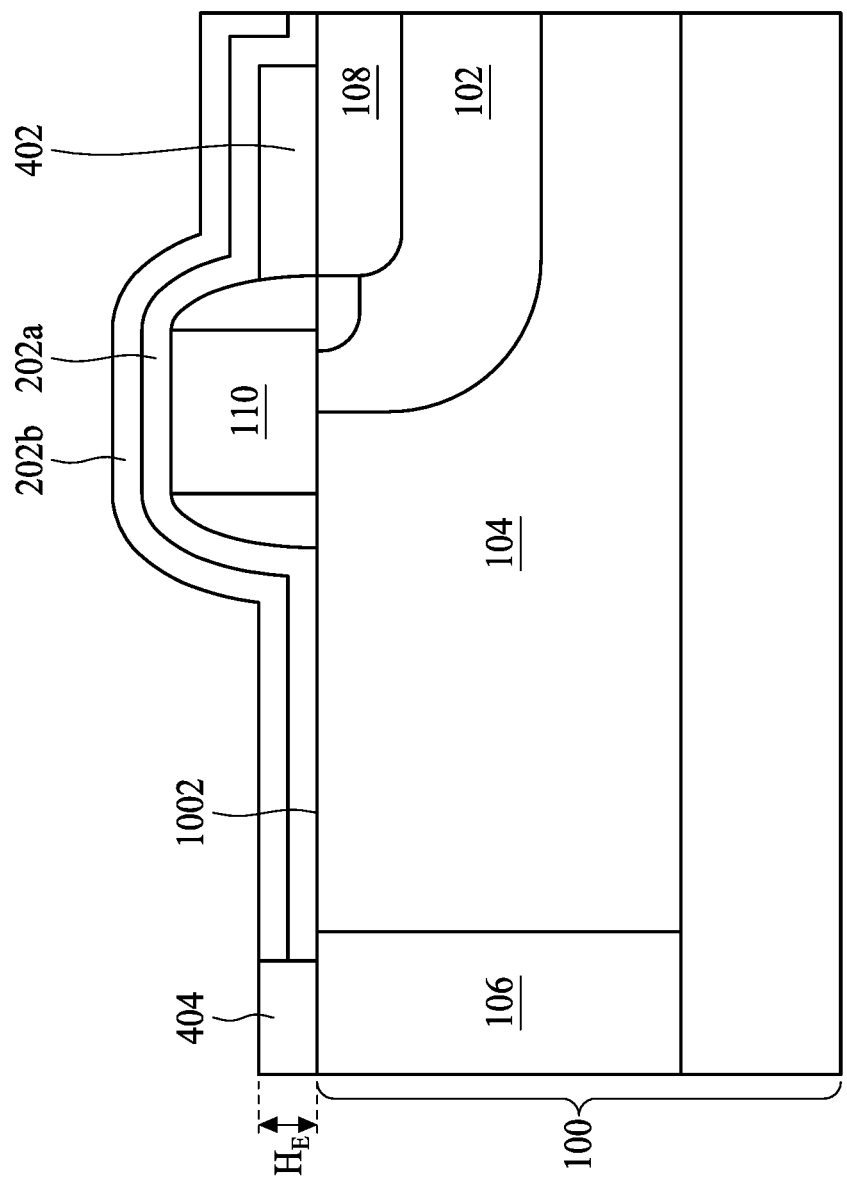

A shown in FIG. 10, a second epitaxial structure 404 is formed on the first surface 1002 of the substrate 100 over the third doped region 102 by epitaxial growth at the second opening 212 (shown in FIG. 9). The second epitaxial structure 404 may be doped during epitaxial growth by adding impurities to the source gas. In some embodiments, the second epitaxial structure 404 has a conductivity type which is as same as the third doped region 106. In some embodiments, the second epitaxial structure 404 is P-doped and the impurities in source gas may be boron, aluminum, gallium, or combination thereof. In some embodiments, the second epitaxial structure 404 has P-type conductivity and is integrated with the third doped region 106.

In some embodiments, the second epitaxial structure 404 is protruded from the first surface 1002 of the substrate 100 with a height $H_E$ from about 200 Å to about 800 Å over the first surface 1002 of the substrate 100. The height $H_E$ depends on the extent of recess of the contact plugs (not shown) into the second epitaxial structure 404. In some embodiments, the height $H_E$ is greater than the recess of the contact plugs in the second epitaxial structure 404, so that the contact plugs are raised from the first surface 1002 of the substrate 100.

By forming the second epitaxial structure 404, a bottom portion of the contact plugs may be in contact with and surrounded by the second epitaxial structure 404 instead of the substrate 100. Accordingly, third doped region 106 in the substrate 100 may not be damaged by etching or ion implantation operations conducted during the contact formation operation. In other words, the damaged region and the disorder cluster caused by etching and ion implantation, if any, may be spaced from the photodiode region by the second epitaxial structure 404. Therefore, the dark current and white pixel may be alleviated.

In some embodiments, the first epitaxial structure 402 is not formed prior to forming the second masking layer 202. The second masking layer 202 and the second epitaxial structure 404 may form subsequently without the first epitaxial structure 402. Accordingly, the image sensor structure may only include the second epitaxial structure 404 as later described in FIG. 14C. In some embodiments, the first epitaxial structure 402 is formed after forming the second masking layer 202. In other words, the forming operations of the first epitaxial structure 402 and the second epitaxial structure 404 may be exchanged.

Figure 11:
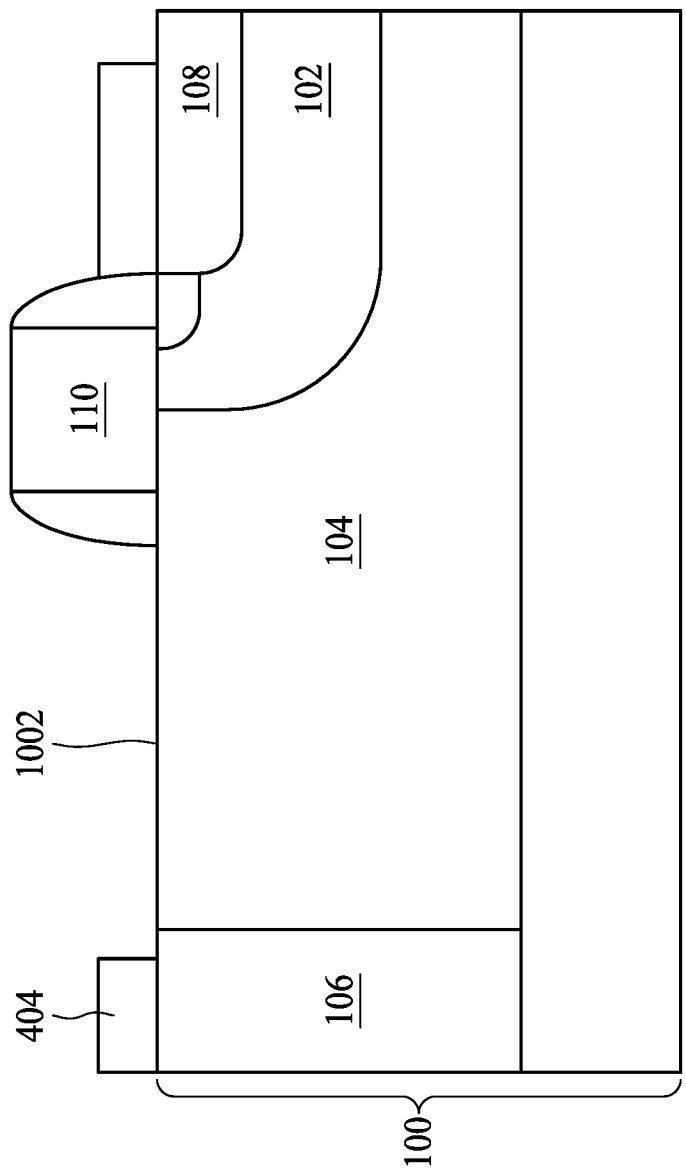

As shown in FIG. 11, after forming the second epitaxial structure 404, the second oxide layer 202*a* (shown in FIG. 10) and the second silicon nitride layer 202*b* (shown in FIG. 10) are both removed to expose the first epitaxial structure 402, the gate structure 110, and the second doped region 104. In some embodiments, the first masking layer 200 includes the second oxide layer 202*a* and the second silicon nitride layer 202*b* is removed by using a technique such as chemical-mechanical polishing (CMP), plasma etching, wet etching, or dry etching.

Figure 12:
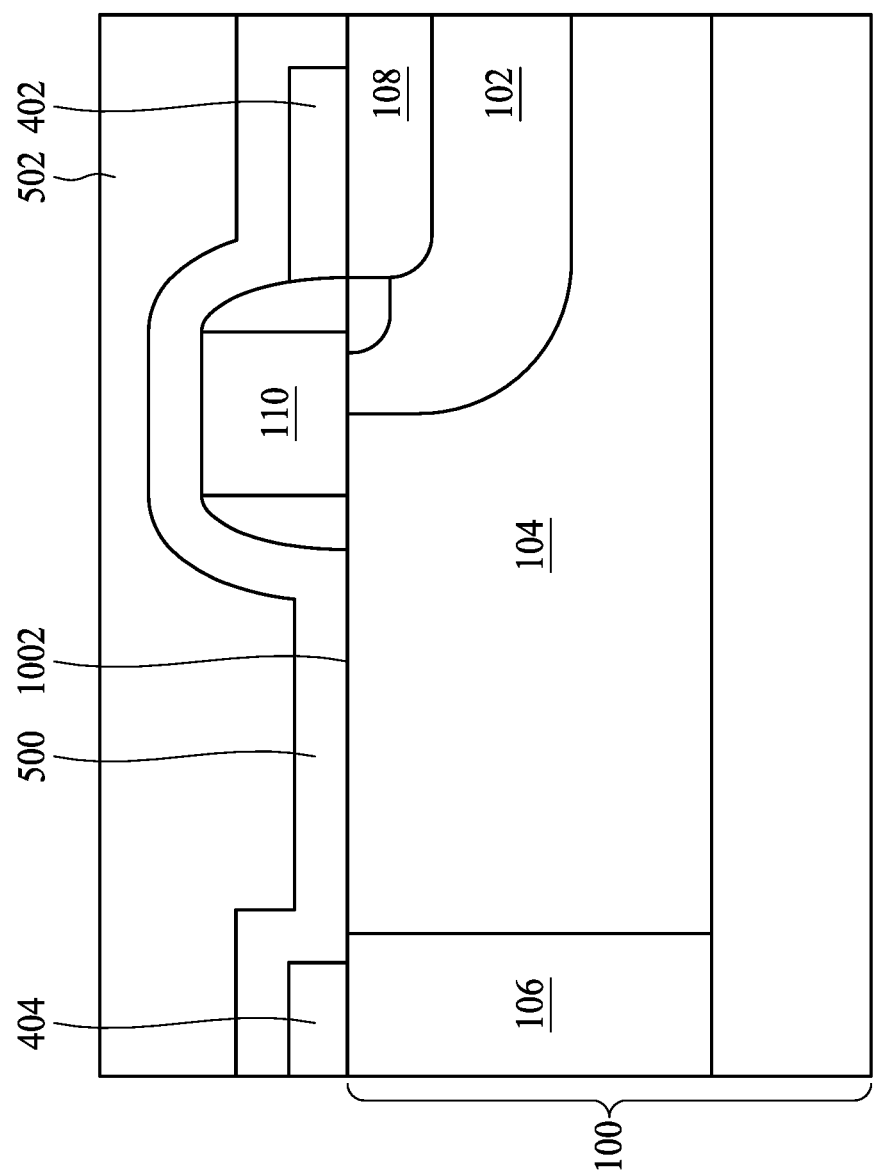
FIGS. 12 and 13 illustrate cross-sectional views at various operations of manufacturing an image sensor structure according to some embodiments of the present disclosure.

As shown in FIG. 12, in some embodiments, a contact etch stop layer (CESL) 500 may form over the first epitaxial structure 402, the gate structure 110, the second doped region 104, and the second epitaxial structure 404. The contact etch stop layer 500 may be formed of silicon oxynitride, which may also be used to reflect light that is not initially captured by the second doped region 104 back towards the second doped region 104. This enhanced reflectivity increases the overall efficiency of the image sensor structure. However, other materials, such as silicon nitride, nitride, boron nitride, combinations thereof, or the like, may alternatively be used. In some embodiments, the contact etch stop layer 500 is formed through chemical vapor deposition (CVD) to a thickness of between about 300 Å and about 400 Å.

In some embodiments, the contact etch stop layer 500 is not only over the first epitaxial structure 402, the gate structure 110, and the second epitaxial structure 404, but also formed at the sidewalls thereof. Accordingly, the contact etch stop layer 500 is formed laterally surrounding the first epitaxial structure 402, the gate structure 110, and the second epitaxial structure 404.

In some embodiments, an interlayer dielectric (ILD) layer 502 may form over the contact etch stop layer 500. The interlayer dielectric layer 502 may be formed of silicon dioxide, silicon nitride, silicon oxynitride, phosphosilicate glass, borophosphosilicate glass, fluorinated silica glass, carbon doped silicon oxide, Xerogel, Aerogel, amorphous fluorinated carbon, Perylene, bis-benzocyclobutenes, polyimide, or combinations thereof. In some embodiments, the interlayer dielectric layer 502 may have a multilayer structure. In some embodiments, the interlayer dielectric layer 502 is formed by spin-on coating, chemical vapor deposition (CVD), or sputtering.

Figure 13:
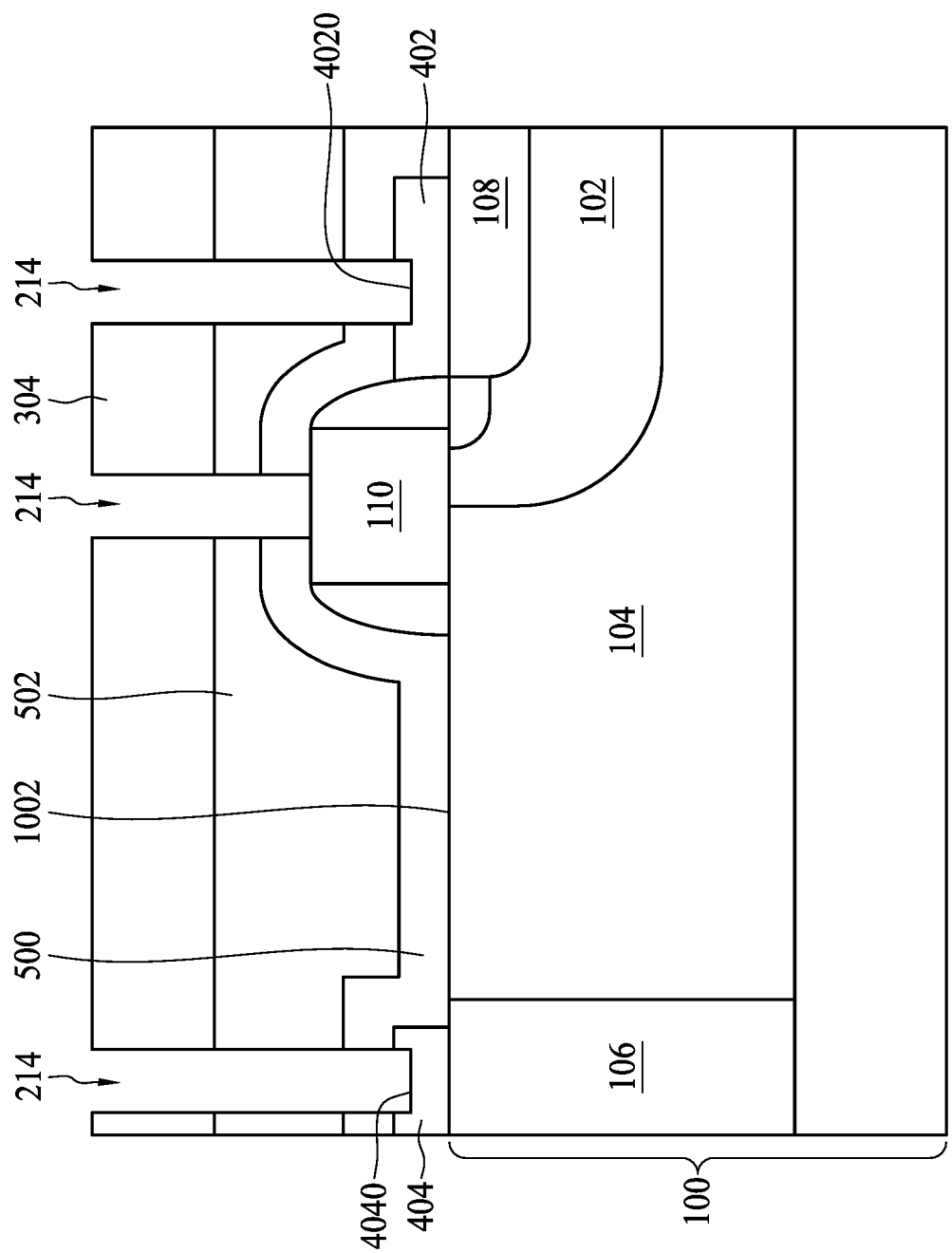

As shown in FIG. 13, a plurality of contact plugs may be formed via contact formation operations. In some embodiments, the contact etch stop layer 500 and the interlayer dielectric layer 502 are patterned to have a plurality of third openings 214 exposing the first epitaxial structure 402, the gate structure 110, and the second epitaxial structure 404. In some embodiments, the contact etch stop layer 500 and the interlayer dielectric layer 502 are patterned by photoresist (PR) and an etching operation. The third photoresist layer 304 is formed on the interlayer dielectric layer 502 with a plurality of patterns to expose the etching regions. In some embodiments, the third photoresist layer 304 is formed by spin-coating or chemical vapor deposition (CVD).

In some embodiments, the first epitaxial structure 402 and the second epitaxial structure 404 are etched to have a first recess 4020 and a second recess 4040 respectively. The first recess 4020 and the second recess 4040 may increase the contact area between the contact plugs and the epitaxial structures. In some embodiments, the bottom of the first recess 4020 and the second recess 4040 are at a level higher than a top surface of the substrate 100 (i.e., the first surface 1002).

As shown in FIG. 13 and FIG. 14A, in some embodiments, the bottoms 602 of the contact plugs 600 are lower than the top surface 4021 of the first epitaxial structure 402 and the top surface 4041 of the second epitaxial structure 404, respectively. Given that the raised epitaxial structure 402 and 404 may possess a height of from about 200 Å to about 800 Å, a depth of the recess 4020 and recess 4040 may at least smaller than the height of the epitaxial structure 402 and 404. In some embodiments, when the recess is shallower than 100 Å, the contact strength may be weak and the resulting contact resistance high. In some embodiments, when the recess is deeper than 300 Å, the damaged structure caused by etching or ion implantation may be too close to the sensitive photodiode region. In some embodiments, the depth of the recesses 4020, 4040 may be in a range of from about 100 Å to about 300 Å, when the height of the raised epitaxial structure 402 and 404 is from about 200 Å to about 800 Å

In some embodiments, the depths of the first recess 4020 and the second recess 4040 are different. In some embodiments, the depth of the recess of an N-doped epitaxial structure is shallower than the recess of a P-doped epitaxial structure. In some embodiments, the depth of the first recess 4020 is about 100 Å, and the depth of the second recess 4040 is about 300 Å.

The contact plugs 600 are formed by conductive materials includes aluminum, aluminum/silicon/copper alloy, titanium, titanium nitride, tungsten, polysilicon, metal silicide, or combinations thereof. In some embodiments, the contact plugs 600 may be formed by an operation including physical vapor deposition (PVD), chemical vapor deposition (CVD). After the contact plugs 600 are formed, the formation operation of front-end-of-line (FEOL) is finished and the operation for forming of back end of line 700 (BEOL) is followed to deposit a plurality of metal wirings 701 between the individual devices in order to interconnect thereof.

Figure 14C:
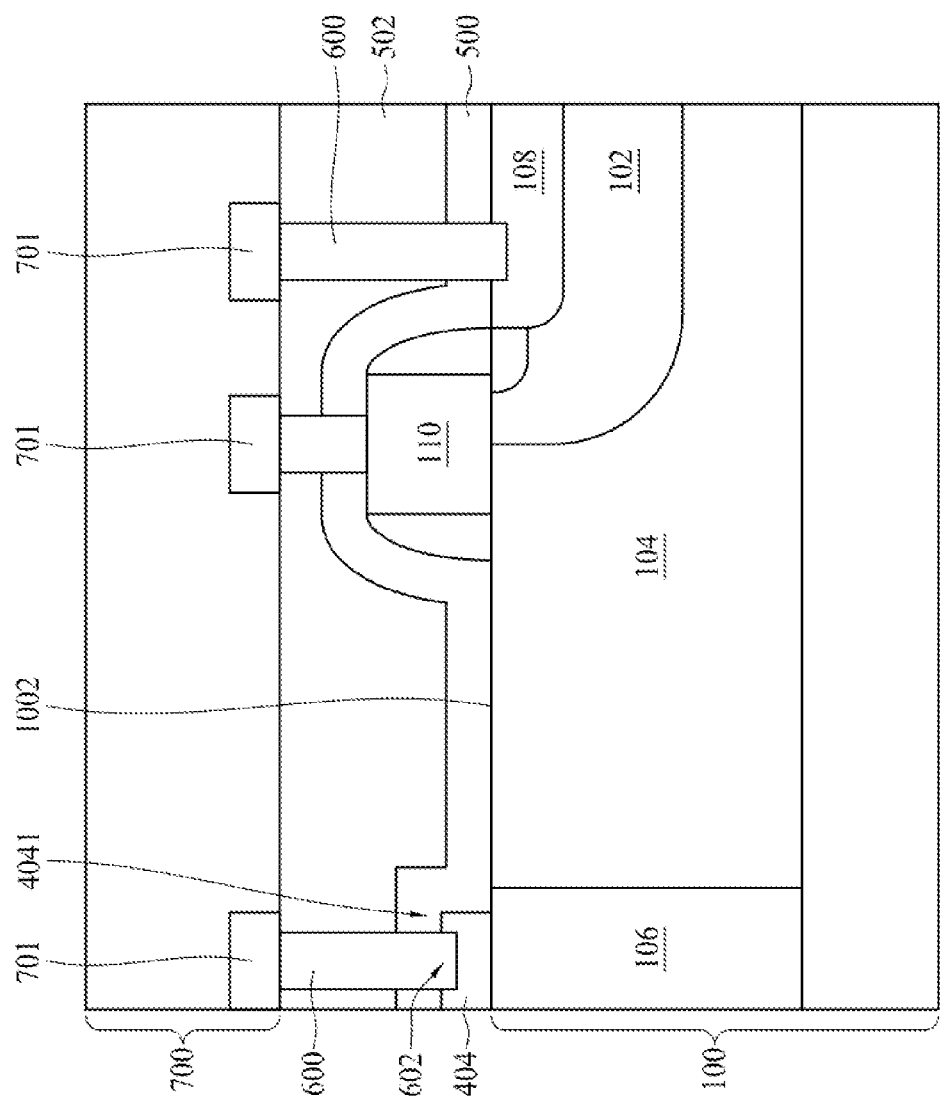
FIG. 14C illustrates a cross-sectional view of an image sensor structure according to some embodiments of the present disclosure.

As shown in FIGS. 14B and 14C, the image sensor structure may include at least an epitaxial structure formed on the first surface 1002 of the substrate 100 to raise the height of the floating node or the third doped region 106 from the first surface 1002. Therefore, at least a portion of the contact plugs 600 may form on the epitaxial structures and alleviate the dark current and white pixel caused by etching and ion implantation during the contact formation operation, whereas some other portion of the contact plugs 600 are formed into the first surface 1002 of the substrate 100. In some embodiments, the forming of the epitaxial structure may depend on the doped region size of the image sensor; for instance, in case of the area ratio between the bottom 602 of the contact plugs 600 and the doped region therebelow is closed (e.g., between 0.3 to 1.0), the damage alleviation by the epitaxial structure may perform apparently.

Figure 15:
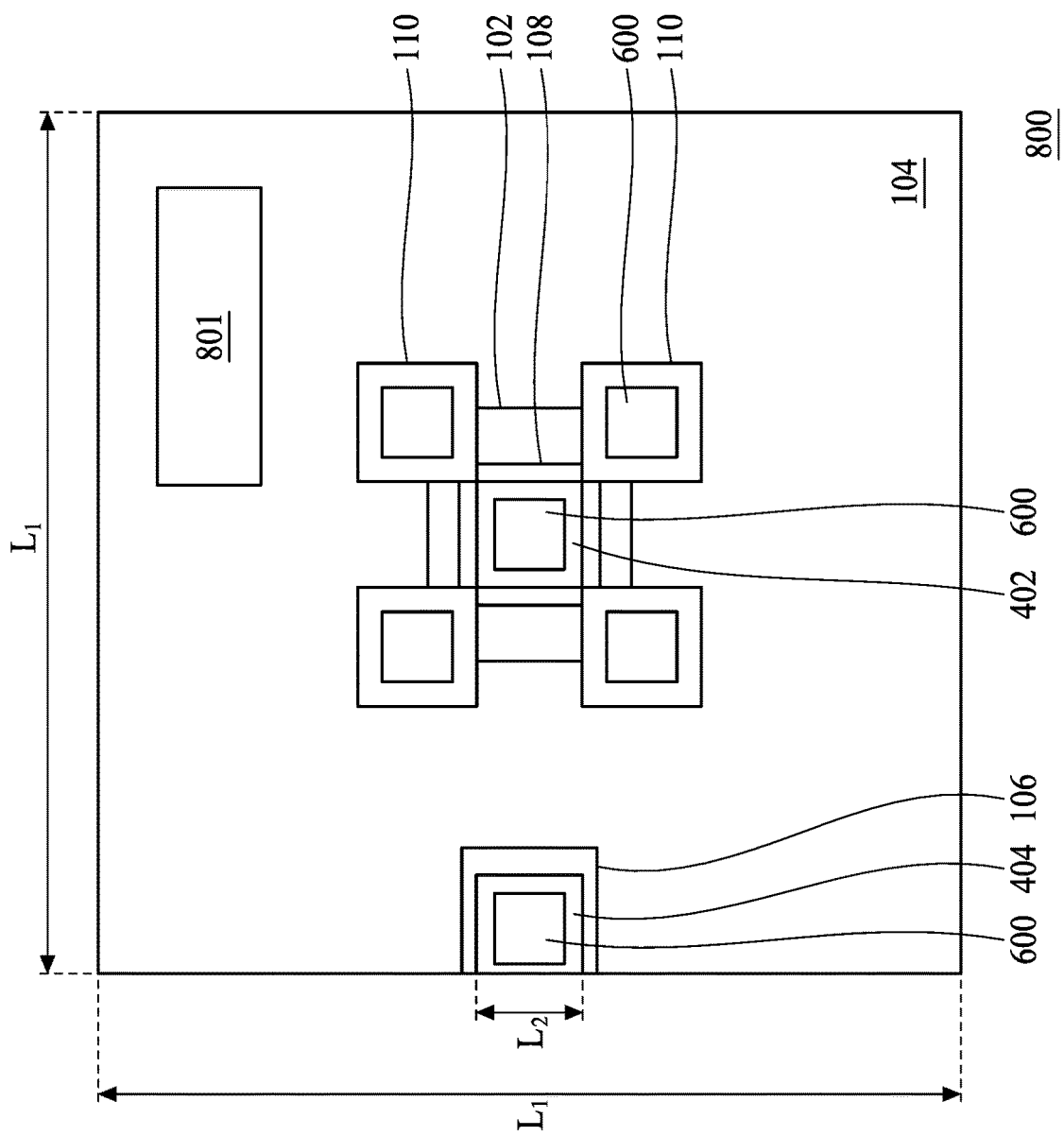
FIG. 15 illustrates a top view of a pixel unit according to some embodiments of the present disclosure.

The image sensor structure manufactured in the operations illustrated in FIG. 2 to FIG. 14A may be used in a pixel unit 800 as shown in FIG. 15. The pixel unit 800 includes a photodetector, which is the image sensor structure manufactured in the present disclosure. In considering the contact formation operation may damage the material integrity in proximity to the photodiode region under the progress of miniaturization, it is advantageous to adopt the raised epitaxial structures to protect the photodiode region from the aforesaid damaged region. For example, when the edge length $L_1$ of the photodiode region is less than 0.8 μm, the raised epitaxial structure integrated with the source and/or drain region of the photodiode structure shows great benefit as far as the dark current and while pixel prevention is concerned. In some embodiments, the pixel unit 800 shown in FIG. 15 also includes a pixel device 801 coupled to the photodetector. In some embodiments, the pixel device 800 includes an addressing transistor that act as a switch of the pixel unit 800. In some embodiments, the edge length $L_2$ of the first epitaxial structure 402 and the second epitaxial structure 404 are less than 0.3 μm. In some embodiments, the edge length $L_2$ of the first epitaxial structure 402 and the second epitaxial structure 404 are different, and the edge length $L_2$ depends on the region size therebelow.

In the present disclosure, the image sensor structure includes at least an epitaxial structure raised from the substrate and integrated with the doped region thereof to decrease the negative effect to the photodiode region of the image sensor structure in contact formation operation. The contact formation operation may damage the structure of photodiode region if the contact plugs are proximity thereto, and it may thus induce defective issues such as dark current and white pixel. In other words, by raising the structure from the flat surface of the substrate, the damages induced from contact formation operation may away from the photodiode region, thus the yield rate of image sensor structure, particularly to those image sensor structures with photodiode regions under the size of 0.8 square um, be improved.

In one exemplary aspect, an image sensor structure is provided. The image sensor structure includes: a substrate, a first doped region, a second doped region, a gate structure, and an epitaxial structure. The substrate has a first surface. The first doped region of a first conductivity type is in the substrate and under the first surface. The second doped region of a second conductivity type is in the substrate and under the first surface. The gate structure is on the first surface of the substrate and overlapping a boundary of the first doped region and the second doped region. The epitaxial structure is on the first surface of the substrate.

In another exemplary aspect, a pixel unit is provided. The pixel unit includes: a photodetector and a pixel device. The pixel device is coupled to the photodetector. The photodetector includes: a substrate, a first doped region, a gate structure, a first epitaxial structure, a second epitaxial structure. The first doped region of a first conductivity type, the second doped region of a second conductivity type, and the third doped region of the first conductivity type are in the substrate. The gate structure is over the substrate and overlapping a portion of the first doped region and the second doped region. The first epitaxial structure is over the first doped region. The second epitaxial structure is over the third doped region.

In yet another exemplary aspect, a method for manufacturing an image sensor structure is provided. The method includes the following operations. A first doped region of a first conductivity type, a second doped region of a second conductivity type interfacing with the first doped region, and a third doped region of the first conductivity type interfacing with the second doped region are formed in a substrate. A first masking layer is formed over a surface of the substrate. A first doped region is exposed from the first masking layer. A first epitaxial structure is formed on the surface of the substrate and over the first doped region.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pixel unit, comprising:
   a photodetector, comprising:
      a substrate having a first surface;
      a first doped region of a first conductivity type, a second doped region of a second conductivity type, and a third doped region of the first conductivity type in the substrate, wherein the first doped region is at a center of the photodetector and surrounded by the second doped, and the third doped region is in proximity to an edge of the photodetector;
      a plurality of gate structures over the substrate and overlapping a single boundary of the first doped region and the second doped region; and
      an epitaxial structure over the first doped region; and
   a pixel device coupled to the photodetector.

2. The pixel unit of claim 1, wherein the photodetector further comprises:
   a first contact plug in contact with the epitaxial structure; and
   a second contact plug penetrates the first surface of the substrate and in contact with the third doped region, wherein the first contact is more in proximity to the gate structure than the second contact plug.

3. The pixel unit of claim 1, wherein a top of the first contact plug and a top of the second contact plug are coplanar with a top surface of a dielectric layer.

4. The pixel unit of claim 1, wherein the photodetector further comprises an etch stop layer over the epitaxial structure, and the etch stop layer is penetrated by the first contact plug and the second contact plug.

5. An image sensor structure, comprising:
a substrate having a first surface;
a first doped region of a first conductivity type in the substrate and under the first surface;
a floating diffusion in the substrate, the floating diffusion is surrounded by the first doped region;
a second doped region of a second conductivity type in the substrate and under the first surface;
a gate structure on the first surface of the substrate and overlapping a boundary of the first doped region and the second doped region;
a third doped region of the first conductivity type in the substrate, interfacing with the second doped region;
an epitaxial structure on the first surface of the substrate, the epitaxial structure is in contact with the floating diffusion;
a first contact plug in contact with the epitaxial structure; and
a second contact plug penetrates the first surface of the substrate and in contact with the third doped region.

6. The image sensor structure of claim 5, wherein a height of the epitaxial structure is about 200 Å to about 800 Å over the first surface of the substrate.

7. The image sensor structure of claim 5, wherein a bottom of the first contact plug is lower than a top surface of the epitaxial structure.

8. The image sensor structure of claim 5, wherein the floating diffusion has the second conductivity type.

9. The image sensor structure of claim 5, further comprising a contact etch stop layer laterally surrounding the epitaxial structure.

10. The image sensor structure of claim 5, wherein a bottom of the first contact plug is spaced from the first surface of the substrate by the epitaxial structure.

11. The image sensor structure of claim 5, wherein a depth of the floating diffusion is swallower than a depth of the third doped region.

12. The image sensor structure of claim 5, wherein a side of the epitaxial structure is aligned with a spacer formed on a sidewall of the gate structure.

13. The image sensor structure of claim 5, wherein an area ratio between a bottom of the second contact plug and third the doped region is between 0.3 to 1.0.

14. The image sensor structure of claim 5, wherein a top of the first contact plug and a top of the second contact plug are coplanar with a top surface of a dielectric layer over the first surface of the substrate.

15. A pixel unit, comprising:
a photodetector, comprising:
a substrate having a first surface;
a first doped region of a first conductivity type, a second doped region of a second conductivity type, and a third doped region of the first conductivity type in the substrate, wherein the third doped region interfaces with the second doped region;
a floating diffusion in the substrate, the floating diffusion is surrounded by the first doped region;
a gate structure over the substrate and overlapping a boundary of the first doped region and the second doped region;
an epitaxial structure over the first doped region, the epitaxial structure is in contact with the floating diffusion;
a first contact plug in contact with the epitaxial structure; and
a second contact plug penetrates the first surface of the substrate and in contact with the third doped region; and
a pixel device coupled to the photodetector.

16. The pixel unit of claim 15, wherein an edge length of the photodiode is less than 0.8 μm.

17. The pixel unit of claim 15, wherein the epitaxial structure has a recess at a top of the epitaxial structure.

18. The pixel unit of claim 17, wherein a bottom of the recess is at a level higher than the first surface of the substrate.

19. The pixel unit of claim 17, wherein the floating diffusion comprises a fifth doped region inside a boundary of the floating diffusion and under a projection of the gate structure.

20. The pixel unit of claim 19, wherein a portion of the floating diffusion is free from covered by the epitaxial structure.

* * * * *